(12) United States Patent
Wang et al.

(10) Patent No.: US 7,923,927 B2
(45) Date of Patent: Apr. 12, 2011

(54) ORGANIC LIGHT EMITTING DISPLAY

(75) Inventors: Chan Hee Wang, Yongin-si (KR); Dae Ho Lim, Yongin-si (KR); Yoon Chan Oh, Yongin-si (KR)

(73) Assignee: Samsung Mobile Display Co., Ltd. (KR)

( * ) Notice: Subject to any disclaimer, the term of this patent is extended or adjusted under 35 U.S.C. 154(b) by 477 days.

(21) Appl. No.: 11/670,356

(22) Filed: Feb. 1, 2007

(65) Prior Publication Data

US 2008/0074036 A1    Mar. 27, 2008

(30) Foreign Application Priority Data

Sep. 21, 2006 (KR) .................. 10-2006-0091835

(51) Int. Cl.
*H01J 1/62* (2006.01)

(52) U.S. Cl. .................. 313/512; 313/504; 313/506

(58) Field of Classification Search ........... 313/498–512
See application file for complete search history.

(56) References Cited

U.S. PATENT DOCUMENTS

| | | | |
|---|---|---|---|
| 2,758,772 | A | 8/1956 | Williams |
| 4,767,965 | A | 8/1988 | Yamano et al. |
| 6,149,053 | A | 11/2000 | Chatterton et al. |
| 6,462,803 | B2 | 10/2002 | Kumagai et al. |
| 6,555,025 | B1 | 4/2003 | Krupetsky et al. |
| 6,801,268 | B2 | 10/2004 | Huang |
| 6,998,776 | B2 | 2/2006 | Aitken et al. |
| 7,217,027 | B2 | 5/2007 | Jung et al. |
| 2001/0035931 | A1 | 11/2001 | Kumagai et al. |
| 2002/0105605 | A1 | 8/2002 | Huang et al. |
| 2004/0207314 | A1 | 10/2004 | Aitken et al. |
| 2005/0140844 | A1* | 6/2005 | Won et al. ........... 349/58 |
| 2005/0231659 | A1* | 10/2005 | Lee ..................... 349/58 |
| 2005/0233885 | A1 | 10/2005 | Yoshida et al. |
| 2005/0259191 | A1* | 11/2005 | Park et al. ........... 349/58 |
| 2006/0023139 | A1 | 2/2006 | Chen |
| 2006/0033412 | A1 | 2/2006 | Lee |
| 2006/0056202 | A1 | 3/2006 | Jung |
| 2006/0072051 | A1 | 4/2006 | Kang et al. |

(Continued)

FOREIGN PATENT DOCUMENTS

CN    1758103 A    4/2006

(Continued)

OTHER PUBLICATIONS

Bratton, W.E. and Davis, J.C., Floating Subassemblies with Impact Absorbing Foam, IBM Technical Disclosure Bulletin, vol. 37, No. 07, Jul. 1994, pp. 187-188.

(Continued)

*Primary Examiner* — Bumsuk Won
(74) *Attorney, Agent, or Firm* — Knobbe Martens Olson & Bear LLP (57) ABSTRACT

Disclosed is an organic light emitting display. The organic light emitting display includes a display panel including a first substrate in which an organic light emitting diode is formed, a second substrate arranged on the top of the first substrate and a sealing material for combining the first substrate with the second substrate. The device includes a bezel including a lower surface and a plurality of sidewalls extending from edges of the lower surface, wherein a space for receiving the display panel is defined by the lower surface and the sidewalls. The device further includes a reinforcing lattice arranged between the display panel and the bezel.

19 Claims, 5 Drawing Sheets

U.S. PATENT DOCUMENTS

| | | |
|---|---|---|
| 2006/0133018 A1 | 6/2006 | Okuda |
| 2006/0158897 A1 | 7/2006 | Choi |
| 2006/0205446 A1 | 9/2006 | Lee et al. |
| 2008/0067933 A1 | 3/2008 | Wang et al. |
| 2008/0074022 A1 | 3/2008 | Wang et al. |

FOREIGN PATENT DOCUMENTS

| | | |
|---|---|---|
| EP | 1460471 | 9/2004 |
| EP | 1659632 | 5/2006 |
| JP | 2-264217 | 10/1990 |
| JP | 10-074583 | 3/1998 |
| JP | 11 231329 | 8/1999 |
| JP | 11-272182 | 10/1999 |
| JP | 2000-181373 A | 6/2000 |
| JP | 2001 126866 | 5/2001 |
| JP | 2001 242792 | 9/2001 |
| JP | 2001-290434 | 10/2001 |
| JP | 2002 099218 | 4/2002 |
| JP | 2002-215051 | 7/2002 |
| JP | 2003 202550 | 7/2003 |
| JP | 2004-309699 | 11/2004 |
| JP | 2005 017483 | 1/2005 |
| JP | 2005 024961 | 1/2005 |
| JP | 2005 051083 | 6/2005 |
| JP | 2005 141194 | 6/2005 |
| JP | 2006 276581 | 10/2005 |
| JP | 2006 053532 | 2/2006 |
| JP | 2006 080067 | 3/2006 |
| JP | 2006 108065 | 4/2006 |
| JP | 2006 146174 | 6/2006 |
| JP | 2006-156361 | 6/2006 |
| JP | 2006 202746 | 8/2006 |
| JP | 2006 244808 | 9/2006 |
| JP | 2006 244809 | 9/2006 |
| JP | 2006 524419 | 11/2006 |
| KR | 102004 0086607 | 11/2004 |
| KR | 10-2005-0070543 A | 7/2005 |
| KR | 10 2005 0003512 | 12/2005 |
| KR | 10 2006 0056811 | 5/2006 |
| KR | 10-2006-0085181 | 7/2006 |
| KR | 10 2006 0039659 | 9/2006 |
| KR | 102006 0039658 | 9/2006 |
| WO | WO 03 005774 A1 | 1/2003 |
| WO | WO 2004 095597 | 11/2004 |

OTHER PUBLICATIONS

Office Action issued on Oct. 10, 2008 in corresponding Chinese Patent Application No. 200710089199X with its English translation in 27 pages.

"Floating Subassemblies with Impact Absorbing Foam", IBM Technical Disclosure Bulletin, IBM Corp., New York, US, vol. 37, No. 7, Jul. 1, 1994, pp. 187-188.

Search Report from the corresponding European Patent Application No. 072524473.3. dated Oct. 19, 2007.

Office Action, mailed Mar. 24, 2009 by JPO for JP Pat App 2006-299305.

Office Action, mailed Mar. 24, 2009 by JPO for JP Pat App 2006-317644.

An Office Action dated Aug. 4, 2009 of the Japanese Patent Appln. No. 2006-317644.

An Office Action dated Jul. 31, 2009 of the Chinese Patent Appln. No. 2007 10089199.X.

Office Action for U.S. Appl. No. 11/670,330.

Final Office Action for U.S. Appl. No. 11/670,330.

Examination Report issued on Jul. 9, 2008 from European Patent Application No. 07252455.6.

Search Report dated Oct. 15, 2007 from European Patent Application No. 07252455.5.

EPO Examination Report issued on Feb. 24, 2009 in corresponding EP App No. 07 252 454.9.

EP Search Report in EP App No. 07252454.9 dated Oct. 19, 2007.

Examination Report issued on Jul. 9, 2008 in EP App No. 07252454.9.

Notice of Allowance in KR App No. 10-2006-0091834 dated Sep. 21, 2007.

Chinese Office Action issued on Oct. 10, 2008 in CN App. No. 2007100794542.

Office Action dated Oct. 13, 2009 of the Japan Patent Application No. 2006-197327.

Office Action dated Sep. 8, 2009 of the Japan Patent Application No. 2006-343291.

* cited by examiner

ORGANIC LIGHT EMITTING DISPLAY

CROSS-REFERENCE TO RELATED APPLICATIONS

This application claims the benefit of Korean Patent Application No. 10-2006-0091835, filed on Sep. 21, 2006, in the Korean Intellectual Property Office, the disclosure of which is incorporated herein by reference in its entirety. This application is related to and incorporates herein by reference the entire contents of the following concurrently filed applications:

| Title | Atty. Docket No. | Filing Date | Application No. |
|---|---|---|---|
| ORGANIC LIGHT-EMITTING DISPLAY | SDISHN.098AUS | | |
| ORGANIC LIGHT-EMITTING DISPLAY DEVICE | SDISHN.100AUS | | |

BACKGROUND

1. Field of the Invention

The present invention relates to an organic light emitting display, and more particularly, to a structure accommodating a display panel.

2. Discussion of Related Art

Recently, the organic light emitting display has been most widely applied and has a relatively simplified structure. The organic light emitting display is a self light emitting element using an organic layer as a light emitting layer. It has an advantage in that it is thin in thickness and light in weight, since it does not need an additional backlight for the light emission, differently from a liquid crystal display (LCD). Accordingly, the organic light emitting display has been actively developed as a display panel in a portable information terminal such as mobile computer, cellular phone, portable game device, electronic book and the like.

In general, the organic light emitting display has a structure in that at least one organic layer including a light emitting layer is disposed between a first electrode and a second electrode. The first electrode is formed on a substrate and functions as an anode for injecting holes and the organic layer is formed on the top of the first electrode. On the organic layer, the second electrode acting as a cathode for injecting electrons is arranged opposite to the first electrode. Such display panel is generally accommodated in a frame The discussion in this section is to provide general background information, and does not constitute an admission of prior art.

SUMMARY

One aspect of the invention provides an organic light emitting display device, which may comprise: a display panel comprising a first substrate, a second substrate, and an array of organic light emitting pixels interposed between the first and second substrates; a backing frame comprising a base plate and a plurality of side walls extending from edges of the base plate, wherein the base plate and the plurality of side walls in combination generally accommodate the display panel such that the first substrate opposes the base plate; and an insert frame interposed between the base plate and the first substrate, wherein the insert frame comprises a plurality of openings allowing the base plate and the first substrate to face each other therethrough.

In the foregoing device, the insert frame may comprise a meshed structure that defines the plurality of openings. The insert frame may comprise a plurality of substantially parallel rods. The insert frame comprises a first rod and a second rod which are substantially parallel and a plurality of interconnecting rods, wherein each of the plurality of interconnecting rods may interconnect the first and second rods. The plurality of interconnecting rods may be substantially parallel to one another. The insert frame may further comprise one or more additional interconnecting rods which interconnect two of the plurality of interconnecting rods. The opening may be a substantially rectangular. The insert frame substantially may prevent the first substrate from contacting the base plate. The first substrate and the base plate may not contact each other through the plurality of openings.

Still in the foregoing device, the first substrate comprises a surface facing the base plate, wherein the base plate comprises a surface facing the first substrate, and wherein the surfaces may be substantially parallel to each other. The insert frame has a thickness in a direction perpendicular to a surface of the base plate facing the first substrate, and wherein the thickness may be about 0.03 to about 0.15 mm. The backing frame may comprise a material selected from the group consisting of metal and polymeric resin. The insert frame may comprise at least one selected from the group consisting of stainless steel, magnesium, magnesium alloy, aluminum, polyethylene, protactinium, polymethylmetacrylate, ABS resin, aromatic liquid crystal polymer, polycarbonate and polyurethane. The plurality of side walls comprises a first side wall opposing a side of the display panel, wherein the first side wall comprises a first wall portion, a second wall portion and a connecting portion interconnecting the first and second wall portions, and wherein the first wall portion may be interposed between the second wall portion and the side of the display panel. The device may further comprise an intervening frame comprising an intervening portion interposed between the first side wall portion and the side of the display panel.

Another aspect of the invention provides a method of making an organic light emitting display device, which may comprise: providing a backing frame comprising a base plate and a plurality of side walls; arranging a display panel such that the base plate and the plurality of side walls in combination generally accommodate the display panel and that the first substrate opposes the base plate, wherein the display panel comprises a first substrate, a second substrate, and an array of organic light emitting pixels interposed between the first and second substrates; and interposing an insert frame between the base plate and the first substrate, wherein the insert frame comprises a plurality of openings allowing the base plate and the first substrate to face each other therethrough.

In the foregoing method, interposing may comprise placing the insert frame on the backing frame and arranging the backing frame and the display panel such that the insert frame is interposed between the base plate and the first substrate. The insert frame may comprise a meshed structure that defines the plurality of openings. The insert frame may comprise a plurality of substantially parallel rods. The insert frame may substantially prevent the first substrate from contacting the base plate.

An aspect of the present invention provides an organic light emitting display that can remarkably reduce an impact applied to a display panel by equipping a reinforcing lattice between a display panel and a bezel for receiving the display panel.

An aspect of the present invention provides an organic light emitting display comprising: a display panel including a first substrate in which an organic light emitting diode is formed, a second substrate arranged on the top of the first substrate and an sealing material for combining the first substrate with the second substrate; a bezel including a lower surface and a plurality of sidewalls extending from edges of the lower surface, wherein a space for receiving the display panel is defined by the lower surface and the sidewalls; and a reinforcing lattice arranged between the display panel and the bezel.

Preferably, the reinforcing lattice includes a horizontal rib and a vertical rib intersecting with each other, or formed with a horizontal rib, otherwise formed with a vertical rib. The reinforcing lattice may be formed with at least one selected from the group consisting of stainless steel, magnesium, magnesium alloy, aluminum, polyethylene, protactinium, polymethylmetacrylate, ABS resin, aromatic liquid crystal polymer, polycarbonate and polyurethane. The sidewall of the bezel may be formed in a double-wall structure, or correspond to three sidewalls of the display panel. Moreover, the sidewall of the bezel may correspond to four sidewalls of the display panel and the height of one sidewall is lower than that of the display panel. The sealing material may be an inorganic material including a frit.

BRIEF DESCRIPTION OF THE DRAWINGS

These and other aspects and advantages of the invention will become apparent and more readily appreciated from the following description of embodiments, taken in conjunction with the accompanying drawings of which.

DETAILED DESCRIPTION OF EMBODIMENTS

Hereinafter, various embodiments of the present invention will be described with reference to the accompanying drawings. The embodiments are provided so that those skilled in the art can sufficiently understand the present invention, but can be modified in various forms which fall within the scope of the present invention.

Figure 1:
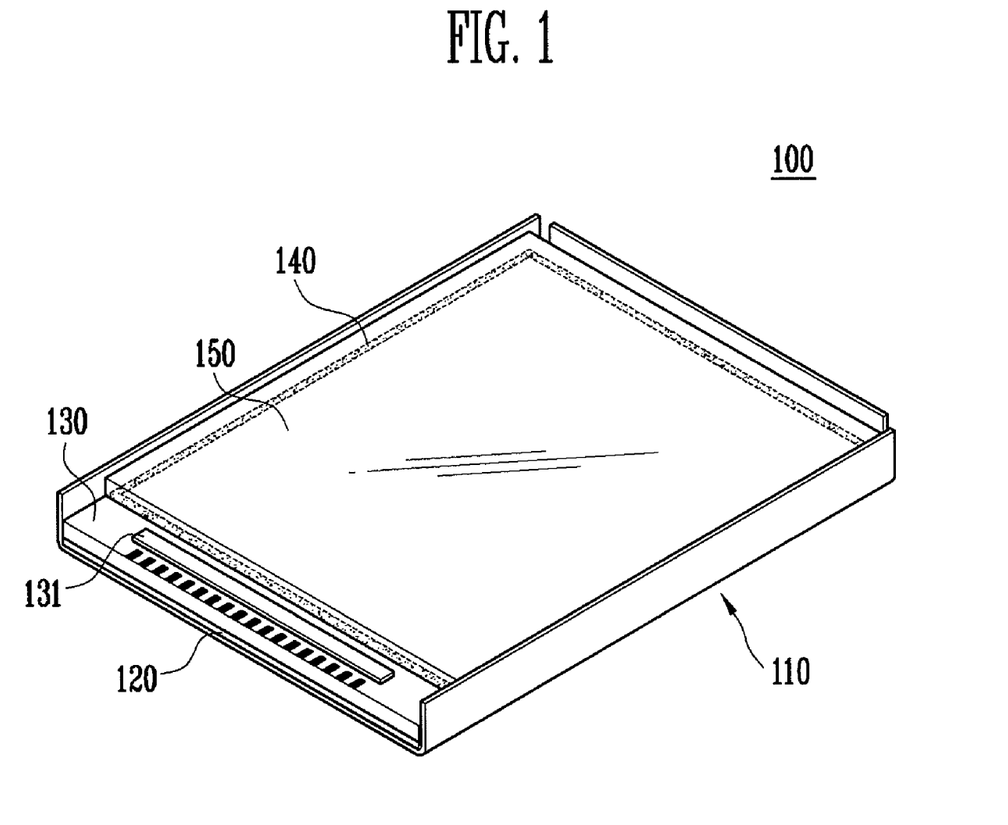
FIG. 1 is a schematic perspective view of an organic light emitting display in accordance with an embodiment of the present invention.
Figure 2:
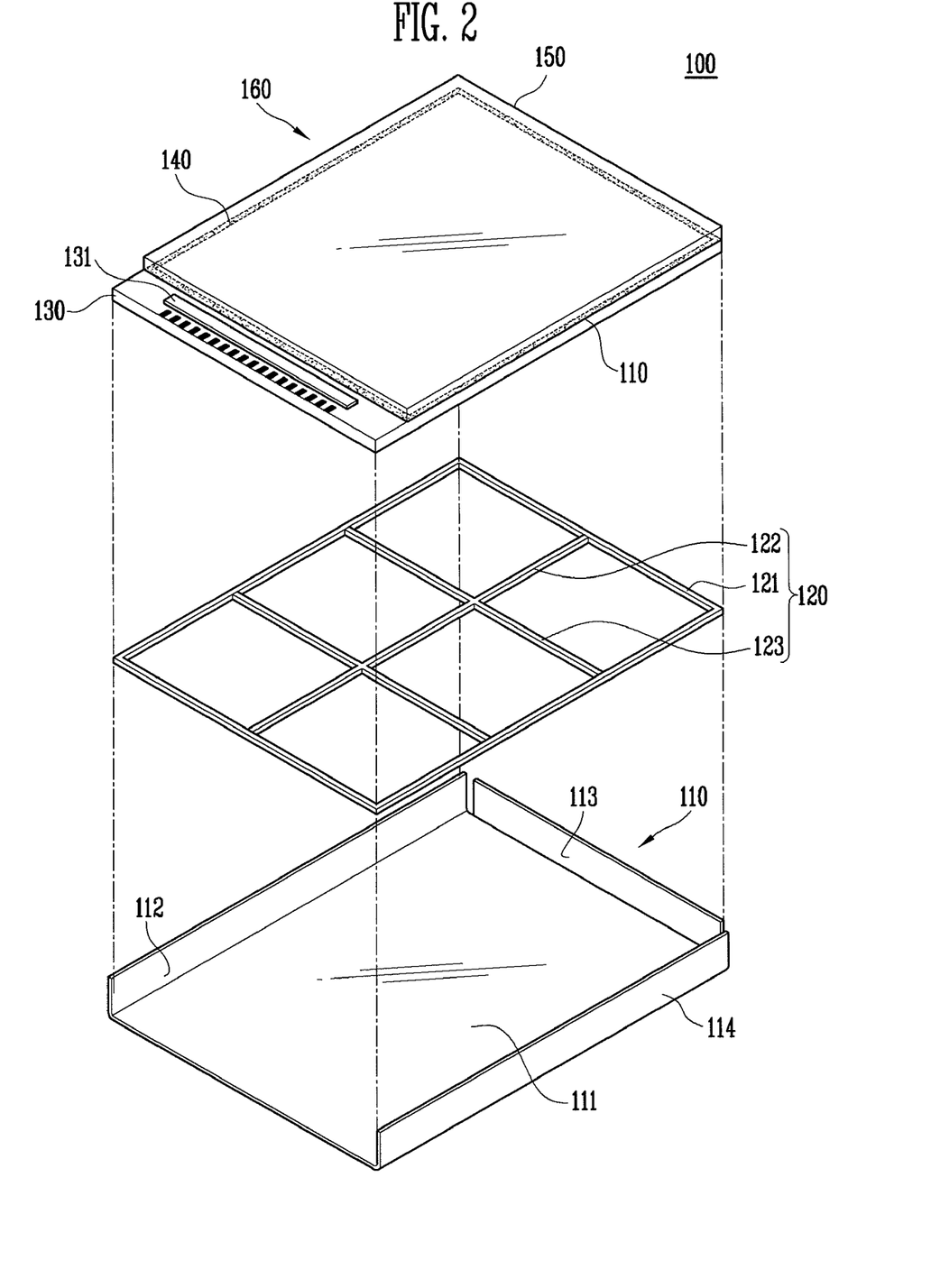
FIG. 2 is an exploded perspective view depicting an organic light emitting display in accordance with an embodiment of the present invention.

FIG. 1 is a schematic perspective view of an organic light emitting display according to an embodiment of the present invention. FIG. 2 is an exploded perspective view depicting an organic light emitting display according to an embodiment of the present invention. Referring FIG. 1 and FIG. 2, the organic light emitting display 100 according to certain embodiments of the present invention comprises a first substrate 130 including an organic light emitting diode, a second substrate 150 arranged on the top of the first substrate 130, a display panel 160 including an sealing material 140 for combining the first substrate 130 with the second substrate 150, a bezel or backing frame 110 including a lower surface or base plate 111 and a plurality of sidewalls 112, 113 and 114 extending from edges of the lower surface 111 and defining a space in which the display panel 160 is accommodated by the lower surface 111 and the sidewalls 112, 113 and 114, and a reinforcing lattice 120 arranged between the display panel 160 and the bezel 110.

The display panel 160 comprises the first substrate 130 including the organic light emitting diode, the second substrate 150 arranged on the top of the first substrate 130, and the sealing material 140 for sealing the first substrate 130 and the second substrate 150. The first substrate 130 comprises a pixel area in which the organic light emitting diodes are established and a non-pixel area. In the pixel area, a plurality of scanning lines, a plurality of data lines and a plurality of organic light emitting diode are provided, each organic light emitting diode being connected with a scanning line and a data line in the form of a matrix, thus constituting a pixel. The non-pixel area includes the plural scanning lines, the plural data lines, extending from the scanning lines and the data lines of the pixel area, electric power supply lines for the operation of the organic light emitting diodes, a scanning drive unit and a date drive unit for processing signals provided from the outside through a pad section 131 and supplying the processed signals to the scanning lines and the data lines.

The organic light emitting diode is composed of an anode electrode, a light emitting layer, and a cathode electrode. If a predetermined voltage is applied to the anode electrode and the cathode electrode, holes injected through the anode electrode and electrons injected through the cathode electrode are recombined to emit light. The pad section 131 is connected with a flexible printed circuit (FPC) of a film type, and signals such as power voltages, scan signals and data signals are input through the FPC linked to the outside.

The second substrate 150, arranged to protect the organic light emitting diodes established on the first substrate 130 from oxygen and/or moisture, comprises the sealing material 140 interposed between the first substrate 130 and the second substrate 150 to combine or seal the first substrate 130 and the second substrate 150. Here, the sealing material 140 is applied along with the circumference of the organic light emitting display. The sealing material 140 can be made of various materials such as inorganic or organic materials. Preferably, the sealing material 140 is formed with an inorganic material. In an embodiment of the present invention, the inorganic sealing material is a frit that intercepts the infiltration of oxygen and moisture more effectively than the other sealing materials. The frit comprises at least one selected from the group consisting of $K_2O$, $Fe_2O_3$, $Sb_2O_3$, $ZnO$, $P_2O_5$, $V_2O_5$, $TiO_2$, $Al_2O_3$, $B_2O_3$, $WO_3$, $SnO$, and $PbO$.

The bezel or backing frame 110 reinforces the strength of the display panel 160. The bezel 110 is composed of a lower surface or base plate 111 and a plurality of sidewalls 112, 113 and 114 extending from edges of the lower surface 111. A space for receiving the display panel 160 is provided by the lower surface 111 and the sidewalls 112, 113 and 114 of the bezel 110. The display panel 160 is accommodated in the bezel 110 in a manner that the substrate 130 of the display panel 160 corresponds to the lower surface 111 of the bezel 110 and the sidewalls of the display panel 160 correspond to the sidewalls 112, 113 and 114 of the bezel 110. Here, it is possible to extend the lower surface 111 of the bezel 110 in the orthogonal direction so that the sidewalls 112,113 and 114 of the bezel 110 are arranged corresponding to the sidewalls of the display panel 160, or to bend the lower surface 111 of the bezel 110. Preferably, the sidewalls 112, 113 and 114 may be formed in a double-wall structure. Moreover, the bezel 110 is formed with metal or plastic.

Meanwhile, the reinforcing lattice or insert frame 120 is arranged between the display panel 160 and the bezel 110. In some embodiments, insert frame 120 may have a meshed structure, a network structure, a lattice structure or a grid structure. The insert frame or reinforcing lattice 120, applied to enhance the durability of the bezel 110 receiving the display panel 160, is formed in a lattice shape in that a plurality of horizontal ribs and a plurality of vertical ribs intersect with each other. The reinforcing lattice 120 comprises a plurality of horizontal ribs or rods 122, a plurality of vertical ribs or rods 123 intersecting with the horizontal ribs 122 vertically and a frame 121 connecting the ends of the horizontal ribs 122 and the vertical ribs 123. The horizontal ribs 122 and the vertical ribs 123 of the reinforcing lattice 120 are formed spaced apart from each to other at regular intervals and the frame 121 is provided in a rectangular shape. Moreover, the horizontal ribs 122, the vertical ribs 123 and the frame 121 may be established in a bar shape having a rectangular section.

The reinforcing lattice 120 is formed with at least one selected from the group consisting of stainless steel (STS, Korean Industrial Standards KS:D3706), magnesium, magnesium alloy, aluminum, polyethylene (PE), protactinium (PA), polymethylmetacrylate (PMMA), ABS resin (acrylonitrile butadiene styrene copolymer), aromatic liquid crystal polymer (LCP), polycarbonate (PC) and polyurethane (PU). Moreover, the reinforcing lattice 120 is formed in a thickness of about 0.03 to about 0.15 mm.

Figure 3:
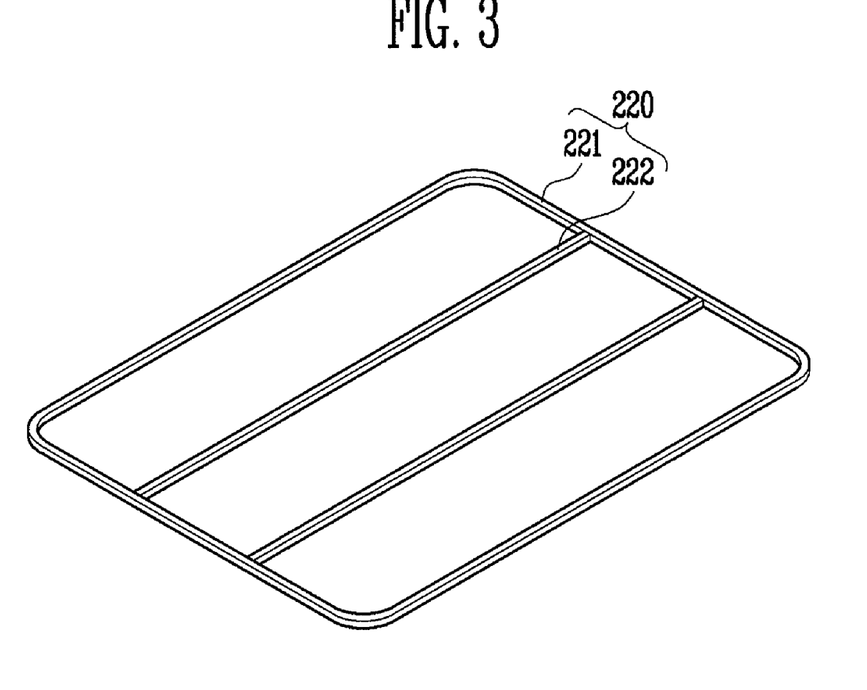
FIG. 3 is a schematic perspective view depicting a reinforcing lattice in accordance with an embodiment of the present invention.

FIG. 3 is a schematic perspective view depicting a reinforcing lattice 220 in accordance with an embodiment of the present invention. Referring to FIG. 3, the reinforcing lattice 220 is composed of a plurality of horizontal ribs 222. The reinforcing lattice 220 comprises the plural horizontal ribs 222 and a frame 221 connecting the ends of the horizontal ribs 222. The plural horizontal ribs 222 are arranged spaced apart from each other at regular intervals and the frame 221 is provided in a rectangular shape. Moreover, the horizontal ribs 222 and the frame 221 may be established in a bar shape having a rectangular section.

Figure 4:
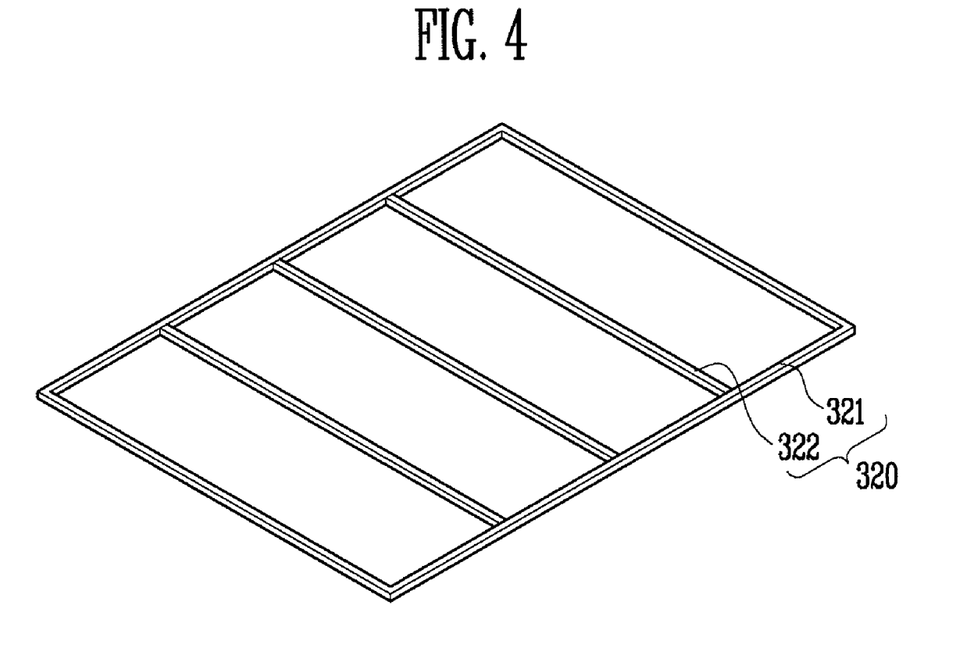
FIG. 4 is a schematic perspective view depicting a reinforcing lattice in accordance with an embodiment of the present invention.

FIG. 4 is a schematic perspective view depicting a reinforcing lattice or insert frame 320 in accordance with another embodiment of the present invention. Referring to FIG. 4, the reinforcing lattice 320 is composed of a plurality of vertical ribs 322. The reinforcing lattice 320 comprises the plural vertical ribs 322 and a frame 321 connecting the ends of the vertical ribs 322. The plural vertical ribs 322 are arranged spaced apart from each other at regular intervals and the frame 321 is provided in a rectangular shape. Moreover, the vertical ribs 322 and the frame 321 may be established in a bar shape having a rectangular section.

Figure 5A:
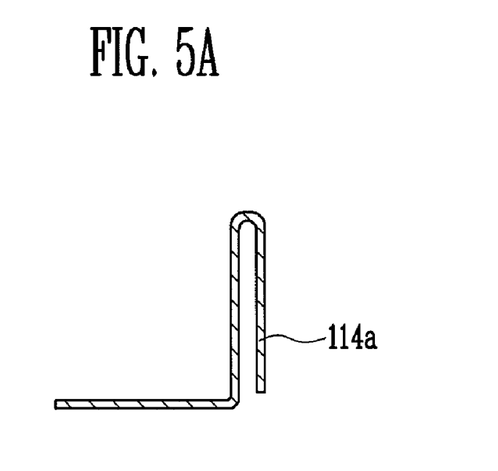
FIGS. 5a to 5f are sectional views depicting bezels having a double-wall structure in accordance with certain embodiments of the present invention.

FIGS. 5a to 5f are sectional views depicting bezels having a double-wall structure in accordance with other embodiments of the present invention. The figures are sectional views showing bezels of other embodiments of the present invention. The sidewall of the bezel may be bent or the bezel may be formed in a double-wall structure by arranging further an auxiliary sidewall on the outer wall thereof. Referring to FIG. 5a, the sidewall 114a of the bezel is bent in the external direction that the display panel is mounted and extends to the bottom of the sidewall 114a, wherein a space is provided between the bent sidewall and the sidewall.

Figure 5B:
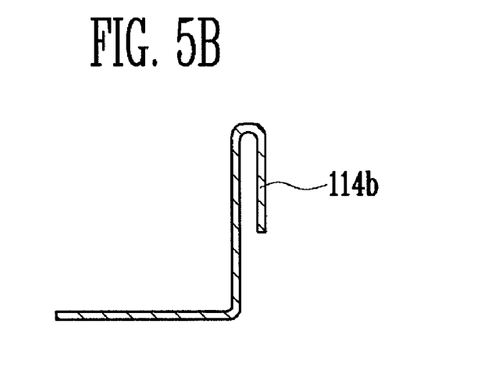
Figure 5C:
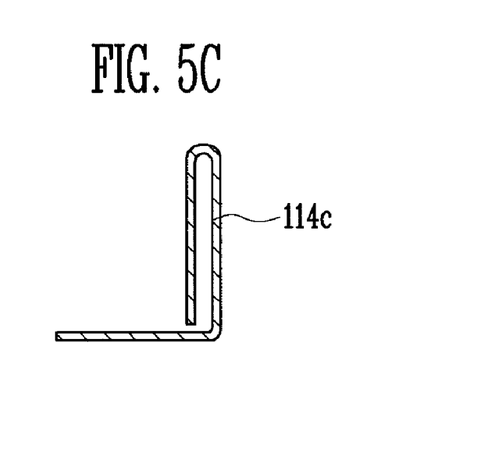
Figure 5D:
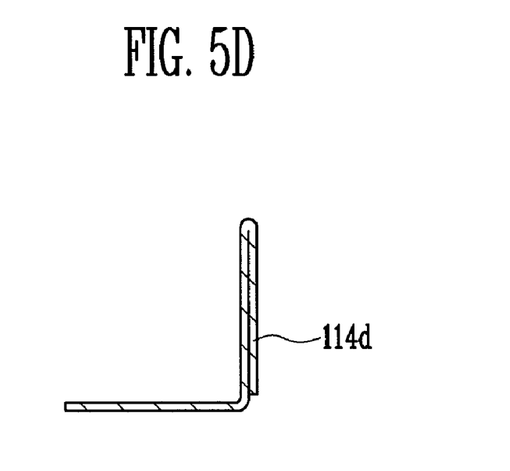
Figure 5E:
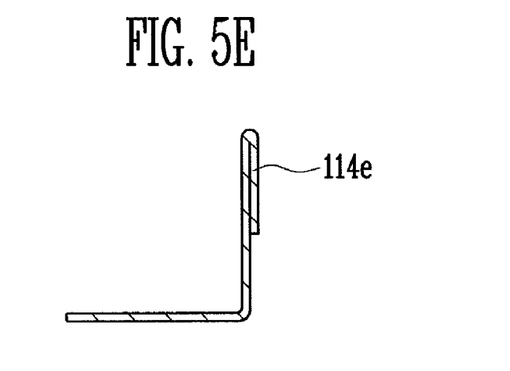
Figure 5F:
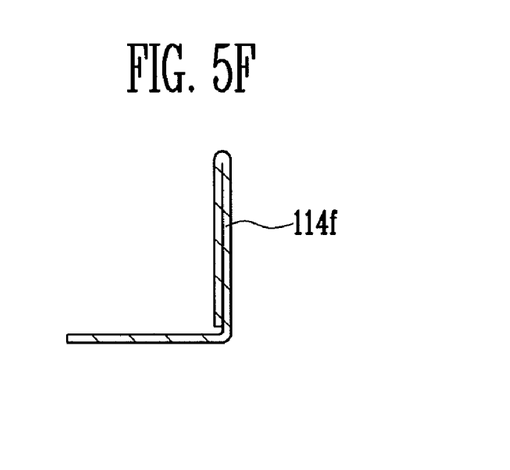

Referring to FIG. 5b, the sidewall 114b of the bezel is bent in the external direction that the display panel is mounted and extends to the middle of the height of the sidewall 114b, wherein a space is formed between the bent sidewall and the sidewall. Referring to FIG. 5c, the sidewall 114c of the bezel is bent in the internal direction that the display panel is mounted and extends to the bottom the sidewall 114c, wherein a space is established between the bent sidewall and the sidewall. Referring to FIG. 5d, the sidewall 114d of the bezel is bent in the external direction that the display panel is mounted and extends to the bottom of the sidewall 114d, wherein the bent sidewall and the sidewall adhere closely to each other. Referring to FIG. 5e, the sidewall 114e of the bezel is bent in the external direction that the display panel is mounted and extends to the middle of the height of the sidewall 114e, wherein the bent sidewall and the sidewall adhere closely to each other. Referring to FIG. 5f, the sidewall 114f of the bezel is bent in the internal direction that the display panel is mounted and extends to the bottom of the sidewall 114f, wherein the bent sidewall and the sidewall adhere closely to each other.

Table 1 indicates the maximum impacts applied to the substrates during the drop tests of the display panels.

TABLE 1

| Test region | Maximum impact (MPa) | | Effect |
| --- | --- | --- | --- |
| | A | B | Decrease (%) |
| First substrate | 133.96 | 87.06 | 35.01 |
| Second substrate | 147.57 | 123.10 | 16.58 |
| Edges of the first and second substrates | 147.57 | 86.40 | 41.45 |

Referring to Table 1, A denotes the exemplary case where the bezel did not apply the double-wall to one sidewall of the display panel and the reinforcing lattice was not included between the display panel and the bezel, and B indicates the case where the bezel of the double-wall structure was applied to one sidewall of the display panel and the reinforcing lattice was arranged between the display panel and the bezel.

Especially, examining A and B based on the maximum impacts, the maximum impacts of A are shown 133.96 MPa in the first substrate, 147.57 MPa in the second substrate and 147.57 MPa on the edges the first substrate and the second substrate, respectively. Moreover, the maximum impacts of B are shown 87.06 MPa in the first substrate, 123.10 MPa in the second substrate and 86.40 MPa on the edges of the first substrate and the second substrate, respectively. As shown in Table 1, comparing the maximum impacts of A and B, the stress levels are decreased 35.01% in the first substrate, 16.58% in the second substrate and 41.45% on the edges of the first substrate and the second substrate, which results from the fact that the impact applied by the external force is absorbed in the reinforcing lattice arranged between the display panel and the bezel.

Figure 6:
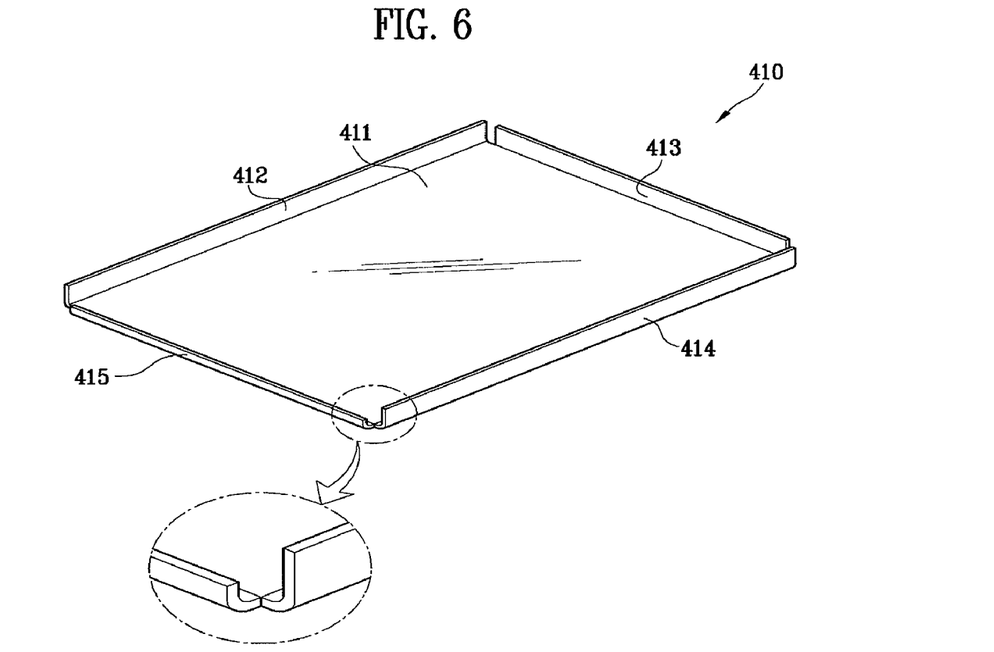
FIG. 6 is a schematic perspective view depicting a bezel in accordance with an embodiment of the present invention.

FIG. 6 is a schematic perspective view depicting a bezel 410 in accordance with an embodiment of the present invention. Referring to FIG. 6, the bezel 410 is composed of a lower surface 411 and four sidewalls 412, 413, 414 and 415 on the edges of the lower surface 411, wherein the height of the sidewall 415 is formed different from those of the other sidewalls 412, 413 and 414. That is, the sidewall 415 is formed in a height identical with or smaller than the first substrate of the display panel such that the FPC is provided readily in the pad section, thus protecting the overall side of the display panel.

Figure 7:
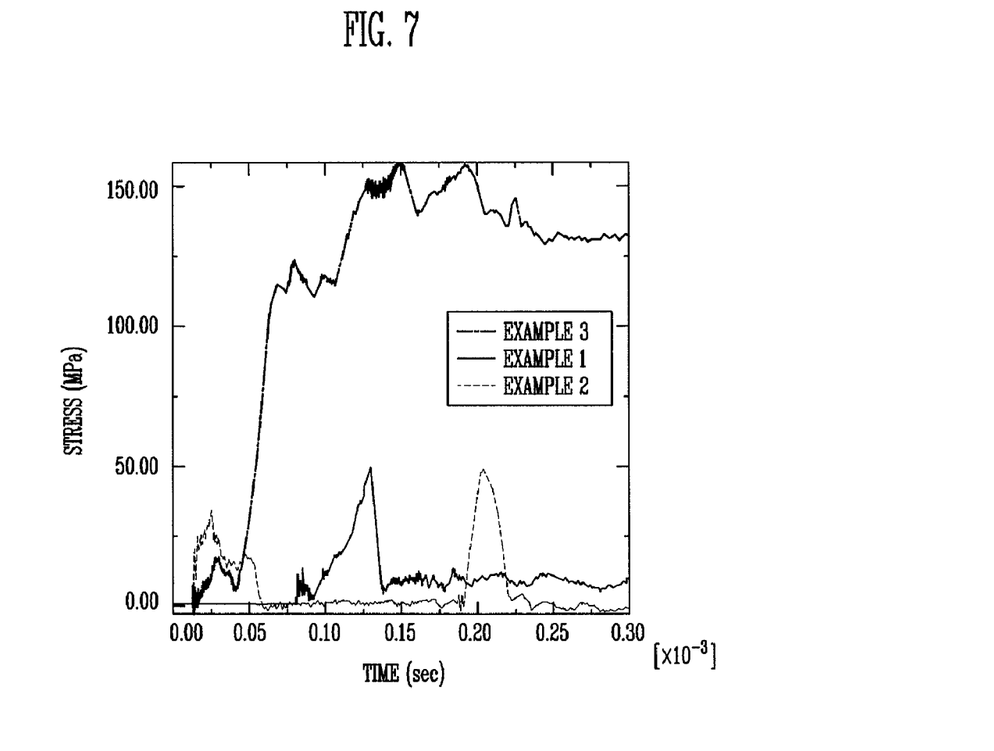
FIG. 7 is a graph showing results of a stress test through drop tests of the display panels in accordance with an embodiment of the present invention.

FIG. 7 is a graph showing results of a stress test through drop tests of the display panels according to an embodiment of the present invention. Referring to FIG. 7, the X-axis of the graph indicates the time (sec) and the Y-axis indicates the stress (MPa) of the display panel. In general, the stress induced in the display panel can be identified by measuring the edge of the substrate. In the case where the substrate is formed of glass, when cutting the glass substrate in a regular size, micro-cracks are formed along with the cut lines. Here, if a stress is applied in the cut lines, breakages occur in the cut lines more readily even with a smaller stress than the other portions having no micro-cracks. Accordingly, reference will now be made as for the stress values obtained on the edges of the display panel.

As shown in the graph, Example 3 is directed to the stress values measured from the substrate of the display panel received in an exemplary bezel. Example 1 shows the stress values measured from the substrate of the display panel, to which a bezel including three sidewalls as depicted in FIG. 1 was applied. Example 2 denotes the stress values measured from the substrate of the display panel, to which a bezel including four sidewalls as depicted in FIG. 6 was applied.

For example, Example 3 shows a stress of about 130.0 MPa at the time of $0.10 \times 10^{-3}$ sec. On the contrary, Example 1 indicates a stress of about 20.0 MPa, and Example 2 denotes a stress of about 4.0 MPa. Moreover, the maximum stress applied to the display panel of Example 3 indicates 158.7 MPa approximately. Whereas, Example 1 shows the maximum stress of about 49.79 MPa and Example 2 denotes the maximum stress of about 48.55 MPa. According to the results as above, the maximum stresses of Examples 1 and 2 are decreased about 68.6% and 69.4% compared with that of Example 3. That is, it can be understood from the above test results that the bezel according to embodiments of the present invention has an improved effect higher than the exemplary bezel protecting the display panel.

As described above, the device according to embodiments of the present invention arranges a reinforcing lattice between the display panel and the bezel receiving the display panel to protect the display panel from the external impact. Further, the device according to embodiments of the present invention can decrease the impact applied to the display panel significantly to prevent the deformation and breakage of the display panel.

As described above, the embodiments of the present invention is disclosed through the descriptions and the drawings. It would be appreciated by those skilled in the art that changes might be made in the discussed embodiments without departing from the principles and spirit of the invention, the scope of which is defined in the claims and their equivalents.

What is claimed is:

1. An organic light emitting display device comprising:
   a display panel comprising a first substrate, a second substrate, and an array of organic light emitting pixels interposed between the first and second substrates;
   a backing frame comprising a base plate and a plurality of side walls extending from edges of the base plate, wherein the base plate and the plurality of side walls in combination accommodate the display panel such that the first substrate opposes the base plate and the side walls oppose edges of display panel; and
   an insert frame interposed between the base plate and the first substrate, wherein the insert frame comprises a plurality of openings allowing the base plate and the first substrate to face each other therethrough;
   wherein the plurality of side walls comprises a first side wall opposing a side of the display panel, wherein the first side wall comprises a first wall portion, a second wall portion and a connecting portion interconnecting the first and second wall portions, and wherein the first wall portion is interposed between the second wall portion and the side of the display panel.

2. The device of claim 1, wherein the insert frame comprises a meshed structure that defines the plurality of openings.

3. The device of claim 1, wherein the insert frame comprises a plurality of substantially parallel rods.

4. The device of claim 1, wherein the insert frame comprises a first rod and a second rod which are substantially parallel and a plurality of interconnecting rods, and wherein each of the plurality of interconnecting rods interconnects the first and second rods.

5. The device of claim 4, wherein the plurality of interconnecting rods are substantially parallel to one another.

6. The device of claim 4, wherein the insert frame further comprises one or more additional interconnecting rods which interconnect two of the plurality of interconnecting rods.

7. The device of claim 4, wherein the opening is a substantially rectangular.

8. The device of claim 1, wherein the insert frame substantially prevents the first substrate from contacting the base plate.

9. The device of claim 1, wherein the first substrate and the base plate does not contact each other through the plurality of openings.

10. The device of claim 1, wherein the first substrate comprises a surface facing the base plate, wherein the base plate comprises a surface facing the first substrate, and wherein the surfaces are substantially parallel to each other.

11. The device of claim 1, wherein the insert frame has a thickness in a direction perpendicular to a surface of the base plate facing the first substrate, and wherein the thickness is about 0.03 to about 0.15 mm.

12. The device of claim 1, wherein the backing frame comprises a material selected from the group consisting of metal and polymeric resin.

13. The device of claim 1, wherein the insert frame comprises at least one selected from the group consisting of stainless steel, magnesium, magnesium alloy, aluminum, polyethylene, protactinium, polymethylmetacrylate, ABS resin, aromatic liquid crystal polymer, polycarbonate and polyurethane.

14. The device of claim 1, further comprising an intervening frame comprising an intervening portion interposed between the first side wall portion and the side of the display panel.

15. A method of making an organic light emitting display device, the method comprising:
   providing a backing frame comprising a base plate and a plurality of side walls;
   arranging a display panel, wherein the display panel comprises a first substrate, a second substrate, and an array of organic light emitting pixels interposed between the first and second substrates, such that the base plate and the plurality of side walls in combination accommodate the display panel and that the first substrate opposes the base plate and that the side walls oppose edges of the display panel; and
   interposing an insert frame between the base plate and the first substrate, wherein the insert frame comprises a plurality of openings allowing the base plate and the first substrate to face each other therethrough;

wherein the plurality of side walls comprises a first side wall opposing a side of the display panel, wherein the first side wall comprises a first wall portion, a second wall portion and a connecting portion interconnecting the first and second wall portions, and wherein the first wall portion is interposed between the second wall portion and the side of the display panel.

16. The method of claim 15, wherein interposing comprises placing the insert frame on the backing frame and arranging the backing frame and the display panel such that the insert frame is interposed between the base plate and the first substrate.

17. The method of claim 15, wherein the insert frame comprises a meshed structure that defines the plurality of openings.

18. The method of claim 15, wherein the insert frame comprises a plurality of substantially parallel rods.

19. The method of claim 15, wherein the insert frame substantially prevent the first substrate from contacting the base plate.

* * * * *

UNITED STATES PATENT AND TRADEMARK OFFICE
CERTIFICATE OF CORRECTION

PATENT NO. : 7,923,927 B2
APPLICATION NO. : 11/670356
DATED : April 12, 2011
INVENTOR(S) : Chan Hee Wang et al.

It is certified that error appears in the above-identified patent and that said Letters Patent is hereby corrected as shown below:

At Column 1, Lines 15-22, Change

"

| Title | Atty. Docket No. | Filing Date | Application No. |
|---|---|---|---|
| ORGANIC LIGHT-EMITTING DISPLAY | SDISHN.098AUS | | |
| ORGANIC LIGHT-EMITTING DISPLAY DEVICE | SDISHN.100AUS | | |

" to

| Title | Filing Date | Application No. |
|---|---|---|
| ORGANIC LIGHT-EMITTING DISPLAY | 2/1/2007 | 11/670,330 |
| ORGANIC LIGHT-EMITTING DISPLAY DEVICE | 2/1/2007 | 11/670,351 |

--.

At Column 1, Line 51, Change "frame" to --frame.--.

At Column 2, Line 31, Change "polymethylmetacrylate," to --polymethylmethacrylate,--.

At Column 3, Lines 20-21, Change "polymethylmetacrylate," to --polymethylmethacrylate--.

At Column 5, Line 33, Change "polymethylmetacrylate" to --polymethylmethacrylate--.

At Column 7, Line 63, in Claim 1, Change "of" to --of the--.

At Column 8, Line 45, in Claim 13, Change "polymethylmetacrylate," to --polymethylmethacrylate,--.

Signed and Sealed this
Fifteenth Day of November, 2011

David J. Kappos
*Director of the United States Patent and Trademark Office*